(12) United States Patent
Masumoto

(10) Patent No.: US 8,131,790 B2
(45) Date of Patent: Mar. 6, 2012

(54) DECIMATION FILTER

(75) Inventor: Takahiko Masumoto, Musashino (JP)

(73) Assignee: Yokogawa Electric Corporation, Musashino-Shi (JP)

( * ) Notice: Subject to any disclaimer, the term of this patent is extended or adjusted under 35 U.S.C. 154(b) by 1158 days.

(21) Appl. No.: 11/927,927

(22) Filed: Oct. 30, 2007

(65) Prior Publication Data

US 2008/0114821 A1 May 15, 2008

(30) Foreign Application Priority Data

Nov. 9, 2006 (JP) ................................. 2006-303461

(51) Int. Cl.
*G06F 17/17* (2006.01)
(52) U.S. Cl. ........................................ 708/313; 706/316
(58) Field of Classification Search .................. 708/313, 708/316
See application file for complete search history.

(56) References Cited

U.S. PATENT DOCUMENTS

| | | | | |
|---|---|---|---|---|
| 5,262,970 | A * | 11/1993 | Sevenhans et al. | 708/313 |
| 6,427,158 | B1 * | 7/2002 | Wang et al. | 708/313 |
| 2002/0078114 | A1 | 6/2002 | Wang et al. | |

FOREIGN PATENT DOCUMENTS

| | | |
|---|---|---|
| JP | 5-283979 A | 10/1993 |
| JP | 06-077769 A | 3/1994 |

OTHER PUBLICATIONS

Korean Office Action dated Nov. 24, 2008.
Office Action dated Apr. 5, 2011, in Japanese Application No. 2006-303461.
Hitoshi Kiya; "Multi rate Signal Processing"; Shokodo Co., Ltd.; Particularly Paragraph 4; pp. 50-77; 4.1.2.; ISBN 4-7856-2012-9.

* cited by examiner

Primary Examiner — Chuong D Ngo
(74) Attorney, Agent, or Firm — Sughrue Mion, PLLC

(57) ABSTRACT

A decimation filter has: a plurality of calculating devices each having a multiplier and an accumulator; a plurality of coefficient memories (a ring memory and shift registers) which store filter coefficients, and which correspond to the calculating devices, respectively; and a selector which sequentially selectively outputs the outputs of the plurality of calculating devices in synchronization with a clock signal. When a decimation ratio is n, filter coefficients which are sequentially shifted by an n number of filter coefficients are read out from the plurality of coefficient memories, and multiplied with a signal in the multipliers of the calculating devices, and results of the multiplications are accumulated in the accumulators to be output.

2 Claims, 4 Drawing Sheets

US 8,131,790 B2

DECIMATION FILTER

This application claims priority to Japanese Patent Application No 2006-303461, filed Nov. 9, 2006, in the Japanese Patent Office. The priority application is incorporated by reference in its entirety.

TECHNICAL FIELD

The present disclosure relates to a decimation filter which converts the frequency of a signal to a lower frequency at a predetermined ratio.

RELATED ART

In the signal processing, it is sometimes required to change the sampling rate of a signal which is sampled at a predetermined sampling frequency. A system for raising a frequency is called an interpolator, and a system for lowering a frequency is called a decimator. The present disclosure relates to a decimator.

In a decimator, a filtering process is performed on data, and then the data are decimated to realize a desired process. In down-sampling to a lower frequency, when a component which is higher than ½ (Nyquist frequency) of the lower frequency is included, foldover distortion (aliasing component) is generated. Therefore, the filtering process is performed in order to restrict the frequency band to the Nyquist frequency or lower. A filter which is used in the filtering process is called a decimation filter.

When a decimator is realized in accordance with the principle, the sampling rate can be converted without using an analog signal. However, there are problems such as that the process burden is increased because the filtering process must be performed at a high rate before down-sampling, and that an ideal filter cannot be used. Therefore, a calculating process is performed while a transfer function H(z) is divided into plural groups of filter coefficients corresponding to a decimation ratio M. This filter configuration is called a polyphase configuration, and a filter having the configuration is called a polyphase filter.

The coefficients of filters in a polyphase configuration are obtained by extracting coefficients at every M number from original filter coefficients. When down-sampling is performed before inputting data to the filters, the filters can operate at a low operation speed caused by the down-sampling. Therefore, an efficient filter can be configured.

FIG. 4 is a diagram showing an example of a decimator which is realized by a polyphase configuration Referring to the figure, a signal which is input from an input side 50 at a higher sampling frequency Fs is output from an output side 51 at a lower sampling frequency Fd. Delay elements 52 are shift registers which delay the signal by 1/Fs period (corresponding to one frequency) Down-samplers 53 which are indicated by [↓D] in the figure down-sample the input signal to a decimation ratio M. $D_0(z) \ldots D_{m-1}(z)$ of polyphase filters 54 are obtained by subjecting the transfer function H(z) to polyphase decomposition, and constitute a group of filters in which filter coefficients are selected at every M number. An adder 55 superimposes the filtered signals on one another.

For example, it is assumed that the transfer function H(z) of filters in which a tap number is n, and which perform decimation of at 1:3 is indicated by the following expression ("*" indicates multiplication sign"):

$$H(z)=h_0+h_1{}^*z^{-1}+h_2{}^*z^{-2}+h_3{}^*z^{-3}+h_4{}^*z^{-4}+\ldots+h_{n-2}{}^*z^{n-2}+h_{n-1}{}^*z^{n-1} \quad (a)$$

Then, three polyphase filters 54 are formed or as $D_0(z)$ to $D_2(z)$, and indicated by the following expressions (in the case where the tap number is a multiple of 3):

$$D_0(z)=h_0+h_3{}^*z^{-1}+h_6{}^*z^{-2}+\ldots+h_{n-3}{}^*z^{-n/3+1} \quad (b)$$

$$D_1(z)=h_1+h_4{}^*z^{-1}+h_7{}^*z^{-2}+\ldots+h_{n-2}{}^*z^{-n/3+1} \quad (c)$$

$$D_2(z)=h_2+h_5{}^*z^{-1}+h_8{}^*z^{-2}+\ldots+h_{n-1}{}^*z^{-n/3+1} \quad (d)$$

In this way, the polyphase filters 54 can perform the filter calculation at the rate obtained after the down-sampling. Therefore, the process burden can be reduced. The outputs are added together by the adder 55, and a final down-sampled signal is output from the output side 51. In the calculations of the polyphase filters 54, an FIR filter (Finite Impulse Response Filter), an IIR filter (Infinite Impulse Response Filter), or an FFT (Fast Fourier Transform) calculation may be used.

[Non-patent Reference 1] "Multi rate signal processing" (SHOKODO Co., Ltd., KIYA, Hitoshi) Particularly, Chapter 4

In the decimator having the above-described related-art configuration, when large decimation in which the decimation ratio is larger than 100 is to be performed, however, the delay elements 52 are required in a large number in proportion to the decimation ratio, and the circuit size is increased (when the decimation ratio is 3 as in the above example, the required number of the delay elements is 3). Furthermore, also the calculation sizes of the polyphase filters 54 are increased. In such a case, a method in which decimation is performed while decimators are divided into several stages is employed.

In an application such as an instrument, by contrast, there is a case where the decimation ratio is large and not previously determined. In such a case, the configuration where decimators are divided into multi stages is not always adequate. Therefore, it is difficult to provide a circuit which can realize a desired decimation filter.

SUMMARY

Exemplary embodiments of the present invention provide a decimation filter which converts the frequency of an input signal to a lower frequency, and which has a filter configuration that can easily cope with an arbitrary decimation ratio without increasing the hardware.

According to one or more embodiments of the present invention, a decimation filter comprises: a plurality of calculating devices each having a multiplier and an accumulator; a plurality of coefficient memories which store filter coefficients, and which correspond to the calculating devices, respectively; and a selector which sequentially selectively outputs outputs of the plurality of calculating devices in synchronization with a clock signal, wherein when a decimation ratio is n, filter coefficients which are sequentially shifted by an n number of filter coefficients are read out from the plurality of coefficient memories, and multiplied with a signal in the multipliers of the calculating devices, and results of the multiplications are accumulated in the accumulators to be output According to the configuration, it is possible to provide a filter configuration which can easily cope with an arbitrary decimation ratio without increasing the hardware.

The plurality of coefficient memories may have a ring memory which stores all filter coefficients that are previously calculated, and from which the filter coefficients are sequentially cyclically read out in synchronization with the clock signal; and a plurality of shift registers which are cascade-connected to the ring memory, the shift registers have a capacity which, when the decimation ratio is n, can store an n number of filter coefficients, and filter coefficients which are read out from the ring memory are stored into and read out from the plurality of shift registers while sequentially shifting the filter coefficients. According to the configuration, a storage capacity required in the coefficient memories can be greatly reduced.

Preferably, the number of the calculating devices is equal to or larger than a value obtained by dividing the number of filter coefficients by the decimation ratio. Alternatively, it is preferable that the number of filter coefficients which are stored in the coefficient memories is equal to or smaller than a value which is obtained by multiplying the number of the calculating devices by the decimation ratio. According to the configuration, the calculation can be performed with efficiently using the provided number of calculating devices.

The present invention can provide a decimation filter which converts the frequency of an input signal to a lower frequency, and which has a filter configuration that can easily cope with an arbitrary decimation ratio without increasing the hardware.

Other features and advantages may be apparent from the following detailed description, the accompanying drawings and the claims.

DETAILED DESCRIPTION

Figure 1:
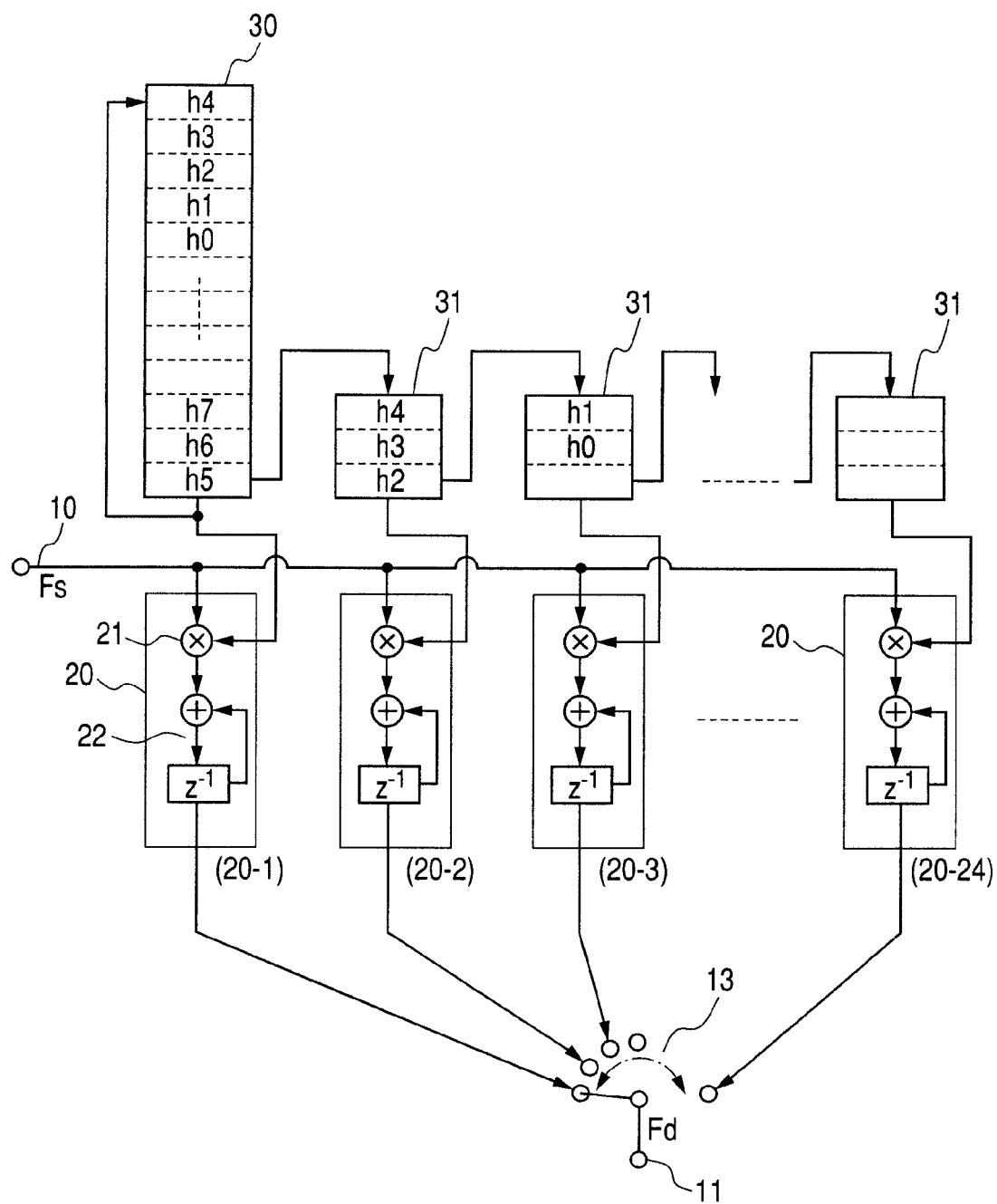
FIG. 1 is a diagram illustrating the configuration of a decimation filter of an embodiment.
Figure 2:
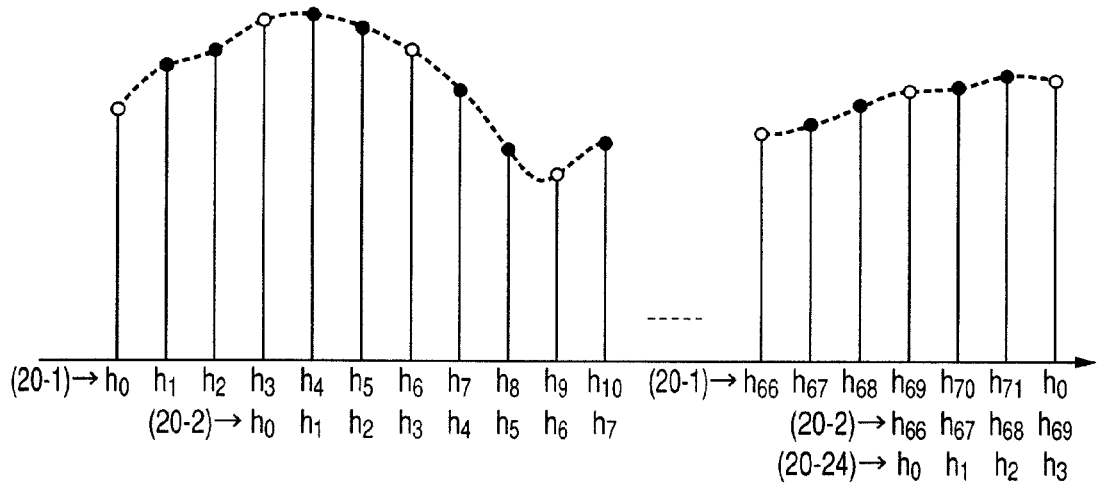
FIG. 2 is a view illustrating relationships between a sampled signal and a filter coefficient.

An embodiment of the decimation filter of the present invention will be described. FIG. 1 is a diagram illustrating the configuration of the decimation filter of the embodiment, and FIG. 2 is a view illustrating relationships between a sampled signal and a filter coefficient. The decimation filter of the present invention is not a polyphase filter. Coefficients, division numbers, other specific numerals, and the like indicated in the following embodiments are mere illustrative examples for facilitating understanding of the present invention, and do not restrict the present invention unless otherwise specified.

In the decimation filter shown in FIG. 1, a signal which is input from an input side 10 at a higher sampling frequency Fs is output from an output side 11 at a lower sampling frequency Fd. The decimation filter comprises: a plurality of calculating devices 20 each configured by a multiplier 21 and an accumulator 22; a ring memory 30 which is an example of the coefficient memories; a plurality of shift registers 31 which are examples of the coefficient memories; and a selector 13 which sequentially selects outputs of the calculating devices 20 to output them.

The ring memory 30 can store all filter coefficients which are previously calculated, and the coefficients can read out sequentially cyclically in synchronization with a clock signal. The shift registers 31 are connected to the ring memory 30 in a cascade manner (hierarchically) so that the filter coefficients read out from the ring memory 30 are stored into and read out from the plurality of shift registers 31 while sequentially shifting the filter coefficients.

The operations of the ring memory 30 and the shift registers 31 will be described in detail. When a filter coefficient is read out from the ring memory 30 into the corresponding calculating device 20, the data of the filter coefficient are simultaneously sent to the first shift register 31. In the ring memory 30, the address of the filter coefficient to be next read out is shifted. In each of the shift registers 31, sent filter coefficients are stored while being sequentially shifted, and, at the timing when the capacity of the shift registers 31 is filled up, the reading from the shift registers 31 to the calculating device 20 is performed. Simultaneously with this reading, the data of the filter coefficient are sent to the next shift register 31. This process is repeated, so that the data of the filter coefficients are moved in the shift registers 31 as if the filter coefficients are pushed.

In the case where the decimation ratio is n, the ring memory 30 stores an n*k−m number of filter coefficients. The shift registers 31 have a capacity (depth) which can store an n number of filter coefficients The coefficient k indicates the number of the calculating devices 20, and is a coefficient which determines the filter tap length, and a value which is, for example, about 24. The coefficient m is an integer which is not less than 0, and, in order to prevent an excess multiplier 21 from being produced, preferably is not larger than n−1.

Preferably, the number of the calculating devices 20 is equal to or larger than a value obtained by dividing the number of the filter coefficients by the decimation ratio. In other words, preferably, the number of the filter coefficients to be stored in the ring memory 30 is equal to or smaller than the value obtained by multiplying the number of the calculating devices 20 by the decimation ratio. According to the configuration, the calculation can be performed with efficiently using the provided number of calculating devices.

The signal which is input from the input side 10 is supplied to one input of the multiplier 21 of each of the plurality of calculating devices 20. The outputs of the ring memory 30 and the shift registers 31 are connected to the other inputs of the multipliers 21, respectively, so that the multiplications of the input signal with the respective filter coefficients are performed The multiplication results are accumulated by the respective accumulators 22 until a series of calculations of the filter tap length is completed, and, when the selector 13 is connected, output to the output side 11.

An example of the operation of the decimation filter will be described with reference to FIG. 2. For example, it is assumed that the decimation ratio is 3, the coefficient k is 24, and the coefficient m is 0. Then, the filter tap length is 72. Therefore, the ring memory 30 has a capacity for storing 72 taps of filter coefficients, and the shift registers 31 have a capacity for storing 3 taps of filter coefficients. In FIG. 1, the calculating devices 20 are sequentially denoted by 20-1, 20-2, 20-3, ..., 20-24 with starting from the left. In FIG. 2, the 72 taps of filter coefficients are denoted by h0, h1, h2, ..., h71, and input signals at sampling points are denoted by d0, d1, d2, ....

Under the above-mentioned conditions, the calculating devices 20-1, 20-2, 20-3, 20-24 perform calculations indicated by the following expressions (e), (f), (g), (h), respectively:

$$(20\text{-}1) d_0 * h_0 + d_1 * h_1 + d_2 * h_2 + d_3 * h_3 + \ldots + d_{69} * h_{69} + d_{70} * h_{70} + d_{71} * h_{71} \quad (e)$$

$$(20\text{-}2) d_3 * h_0 + d_4 * h_1 + d_5 * h_2 + d_6 * h_3 + \ldots + d_{72} * h_{69} + d_{73} * h_{70} + d_{74} * h_{71} \quad (f)$$

$$(20\text{-}3) d_6*h_0+d_7*h_1+d_8*h_2+d_9*h_3+ \ldots +d_{75}*h_{69}+ d_{76}*h_{70}+d_{77}*h_{71} \quad (g)$$

$$(20\text{-}4) d_{69}*h_0+d_{70}*h_1+d_{71}*h_2+d_{72}*h_3+ \ldots +d_{138}*h_{69}+ d_{139}*h_{70}+d_{140}*h_{71} \quad (h)$$

After elapse of n clocks (in the embodiment, 3 clocks) from the start of the calculation by the calculating device 20-1, the calculating device 20-2 starts the calculation. Similarly, the calculating devices 20 start the operation at every n clock.

In the calculating device 20-1, when the calculation indicated by expression (e) is ended, the accumulator 22 is reset, and then the filter calculation indicated by expression (i) is subsequently started at timing of d72. In the calculating devices 20-2 to 20-24, similarly, subsequent data are processed, thereby enabling continuous frequency decimation.

$$(20\text{-}1) d_{72}*h_0+d_{73}*h_1+d_{74}*h_2+d_{75}*h_3+ \ldots +d_{141}*h_{69}+ d_{142}*d_{70}+d_{143}*h_{71} \quad (i)$$

At the timing when the calculating device 20-1 ends the calculation of 72 taps, the selector 13 is connected to the calculating device 20-1. Then, at the rate of ⅓ of the sampling frequency Fs, the calculating devices 20 are sequentially switched to be connected to the selector, thereby outputting the accumulated data. Namely, at the timing when the calculation of expression (e) is ended, the output of the calculating device 20-1 is selected After elapse of 3 clocks from the timing, the output of the calculating device 20-2 is selected, and thereafter the remaining calculating devices are sequentially selected until the calculating device 20-24. Then, the output of the calculating device 20-1 is again selected. At the timing of elapse of 3 clocks from the end of the calculation (h) of the calculating device 20-24, the next calculation of the calculating device 20-1 is ended.

In the thus configured decimation filter, a filter of an arbitrary decimation ratio can be easily configured simply by adjusting the depths (capacities) of the coefficient memories (the ring memory 30 and the shift registers 31). In the related-art example, the numbers or the delay elements 52 and the polyphase filters 54 must be changed, and this change involves extensive modification of the circuits Therefore, it was difficult to realize an arbitrary decimation filter. According to the present invention, by contrast, it is possible to provide a filter configuration which can easily cope with an arbitrary decimation ratio without increasing the hardware.

Particularly, the coefficient memories are configured by the one ring memory 30 and the plurality of shift registers 31, and the filter coefficient data are stored while being sequentially shifted, into the coefficient memories to the subsequent stages. Therefore, each of the coefficient memories is not required to have all filter coefficient data in correspondence with the calculating devices, and a storage capacity required in the coefficient memories can be greatly reduced.

For example, the above decimation filter can be configured by an FPGA. A recent FPGA incorporates 100 or more sets of such a multiplier 21 and a memory (the ring memory 30 and the shift registers 31), and therefore is optimum for realizing the configuration. When the filter is configured by using an FPGA, the number of the calculating devices 20 and the capacity (depth) of the memory can be adequately set in a dynamic manner.

The number of the calculating devices 20 corresponds to the filter tap length. The required filter characteristics can be adjusted by increasing or decreasing the number of the calculating devices 20. In the case where steep transient characteristics are required in a cut-off frequency region, the number of the calculating devices 20 is increased. By contrast, in the case where filter conditions can be relaxed to an allowable degree, the number of the calculating devices 20 can be decreased, so that a decimation filter which can be economically realized can be configured.

The calculating devices 20 always operate without producing a wasted time period, and can perform a calculating process at a speed higher than that of the case where a computer having a usual multi-core configuration perform a software process. In an instrument such as an IC tester or a memory tester, in the case where an input signal must be decimated at different ratios according to objects to be measured, particularly, a filter is configured in the above-described manner, whereby a high-speed and highly accurate filter which operates in real time can be realized.

Other Embodiment

In the above-described embodiment, the coefficient memories are configured by the one ring memory 30 and the plurality of shift registers 31. Alternatively, all the coefficient memories may be configured by ring memories, whereby the present invention can be realized.

Figure 3:
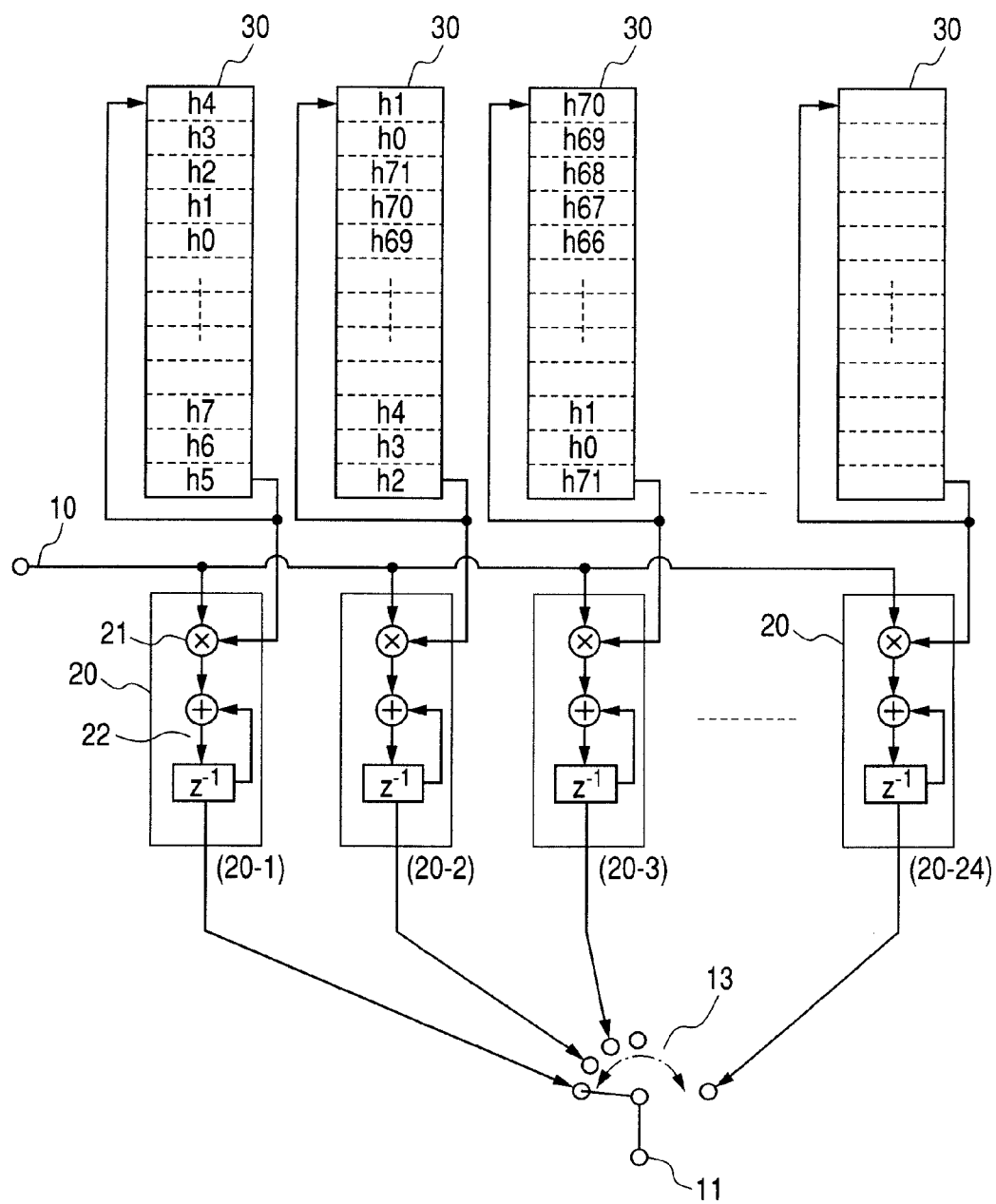
FIG. 3 is a diagram illustrating another configuration example of the decimation filter.
Figure 4:
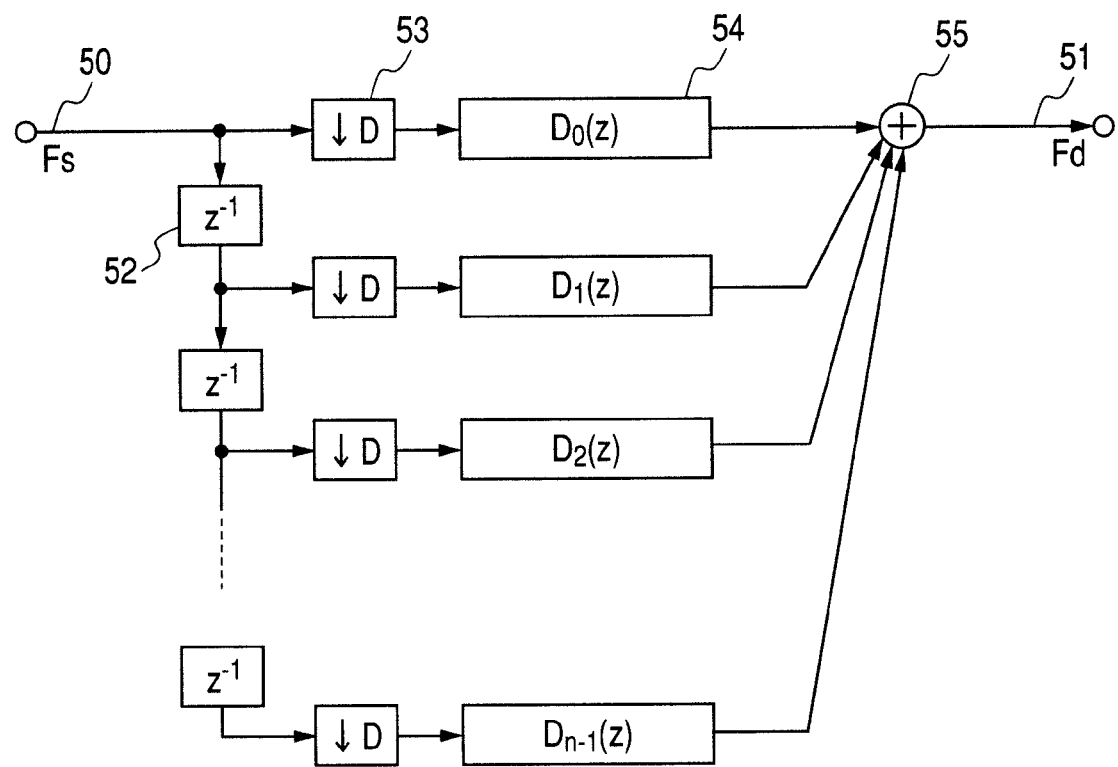
FIG. 4 is a diagram showing an example of a decimator which is realized by a polyphase configuration.

FIG. 3 is a diagram illustrating another configuration example of the decimation filter. In FIG. 3, the shift registers 31 are not disposed, and all the coefficient memories are configured by ring memories 30. Each of the ring memories 30 stores all filter coefficients which are previously calculated In the case where the decimation ratio is n, filter coefficients which are shifted from one another by an n number of filter coefficients are sequentially read out from each of the ring memories 30. In each of the calculating devices 20, the read-out filter coefficients and the signal are multiplied with each other by the multiplier 21, accumulated in the accumulator 22, and then output, whereby the same calculating process as that in the above-described embodiment can be performed.

When the decimation ratio is 1, the decimation filter of the present invention functions as a usual FIR filter, and therefore can be used also as a high-speed and highly accurate FIR filter which operates in real time.

Although the present invention has been described with reference to the preferred embodiments with reference to the accompanying drawings, it is a matter of course that the present invention is not restricted to them. It is obvious to those skilled in the art that various modifications and variations are possible within the scope of the appended claims. These modifications and variation are intended to fall within the technical scope of the present invention.

The present invention can be used as a decimation filter which converts the frequency of a signal to a lower frequency at a predetermined ratio.

What is claimed is:

1. A decimation filter comprising:
    a plurality of calculating devices each having a multiplier and an accumulator;
    a plurality of coefficient memories which store filter coefficients, and which correspond to said calculating devices, respectively; and
    a selector which sequentially selects outputs of said plurality of calculating devices in synchronization with a clock signal,
    wherein when a decimation ratio is n, filter coefficients which are sequentially shifted by n are read out from said plurality of coefficient memories, and multiplied with a signal in said multipliers of said calculating devices, and results of the multiplications are accumulated in said accumulators to be output wherein said plurality of coefficient memories have a ring memory which stores all filter coefficients that are previously calculated, and from which the filter coefficients are sequentially cyclically read out in synchronization with said clock signal, and a plurality of shift registers which are cascade-connected to said ring memory, and wherein said shift registers have a capacity which, when the decimation ratio is n, can store an n number of filter coefficients, and filter coefficients which are read out from said ring memory are stored into and read out from said plurality of shift registers while sequentially shifting the filter coefficients.

2. A decimation filter according to claim 1, wherein the number of said calculating devices is equal to or larger than a value obtained by dividing the number of filter coefficients by the decimation ratio.

* * * * *